US 6,224,669 B1

(12) United States Patent
Yi et al.

(10) Patent No.: US 6,224,669 B1
(45) Date of Patent: May 1, 2001

(54) METHOD FOR FABRICATING A SEMICONDUCTOR STRUCTURE HAVING A CRYSTALLINE ALKALINE EARTH METAL OXIDE INTERFACE WITH SILICON

(75) Inventors: Zhiyi Yi, Gilbert; Ravindranath Droopad, Tempe; Corey Daniel Overgaard, Phoenix; Jamal Ramdani, Gilbert; Jay A. Curless, Tempe; Jerald A. Hallmark, Gilbert; William J. Ooms, Chandler; Jun Wang, Gilbert, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 12 days.

(21) Appl. No.: 09/662,390

(22) Filed: Sep. 14, 2000

Related U.S. Application Data

(62) Division of application No. 09/273,929, filed on Sep. 14, 2000.

(51) Int. Cl.[7] .................................................... C03B 25/14

(52) U.S. Cl. ............................ 117/108; 117/109; 117/944

(58) Field of Search .................................... 117/108, 109, 117/944

(56) References Cited

U.S. PATENT DOCUMENTS

| 5,225,031 | 7/1993 | McKee et al. . |
| 5,393,352 | 2/1995 | Summerfelt ............... 148/33.3 |
| 5,450,812 | 9/1995 | McKee et al. .............. 117/84 |
| 5,482,003 | 1/1996 | McKee et al. . |
| 5,514,484 | 5/1996 | Nashimoto ................. 428/700 |
| 5,767,543 | 6/1998 | Ooms et al. . |
| 5,830,270 | 11/1998 | McKee et al. ............. 117/106 |
| 6,022,140 | 2/2000 | Fraden et al. .............. 374/158 |
| 6,023,082 | 2/2000 | McKee et al. ............. 257/295 |
| 6,113,690 | 9/2000 | Yu et al. ..................... 117/84 |

FOREIGN PATENT DOCUMENTS

| 4120258 | 6/1991 | (DE) ................... H01L/39/24 |
| 4120258 | 12/1992 | (DE) . |
| 0812494 | 1/1996 | (JP) ..................... C30B/29/22 |
| 9315897 | 12/1997 | (JP) . |

OTHER PUBLICATIONS

"Molecular Beam Epitaxy of $SrTiO_3$ Films on Si(100)–2 × 1 with SrO Buffer Layer", Toyokazu Tambo et al., Japanese Journal of Applied Physics, vol. 37, No. 1, pp. 4454–4459.

"Roles of buffer Layers in E;itaxial Growth of $SrTiO_3$ Films on silicon Substrates", Bum Ki Moon et al., Japanese Journal of Applied Physics, vol. 33, pp. 1742–1477.

"Growth of Crystalline $SrTiO_3$ Films on Si Substrates Using Thin Flouride Buffer Layers and Their Electrical Properties", Bum Ki Moon et al., Jpn. J. Appl. Phys., vol. 33 (1994), pp. 5911–5916.

"Heteroepitaxy of Dissimilar Materials", Materials Research Society Symposium Proceedings, vol. 221, pp. 29–34.

"Heteroepitaxy on Silicon: Fundamentals, Structure, and Devices", Materials Research Society Symposium Proceedings, vol. 116, pp. 369–374.

"A Preliminary Consideration of the Growth Behaviour of $CeO_2$, $SrTiO_3$ and $SrVO_3$ films on Si Substrate", Hirotoshi Nagata, Thin Solid Films, 224(1993), pp. 1–3.

(List continued on next page.)

Primary Examiner—Robert Kunemund
(74) Attorney, Agent, or Firm—William E. Koch

(57) ABSTRACT

A method for fabricating a semiconductor structure comprises the steps of providing a silicon substrate (10) having a surface (12); forming on the surface of the silicon substrate an interface (14) comprising a single atomic layer of silicon, oxygen, and a metal; and forming one or more layers of a single crystal oxide (26) on the interface. The interface comprises an atomic layer of silicon, oxygen, and a metal in the form $XSiO_2$, where X is a metal.

36 Claims, 4 Drawing Sheets

OTHER PUBLICATIONS

"Heteroepitaxial Growth of $CeO_2(001)$ Films on Si(001) Substrates by Pulsed Laser Deposition in Ultrahigh Vacuum", Hirotoshi Nagata et al., Jpn. J. Appl. Phys., vol. 30 (1991), pp. 1136–1138.

"Heteroepitaxial Growth of SrO films on Si Substrates", Yuichi Kado et al., J. Appl. Phys. 61(6), 1987, pp. 2398–2400.

"Silicon Molecular Beam Epitaxy", Materials Research Society Symposium Proceedings, vol. 220, pp. 595–600.

"Effects of Buffer Layers in Epitaxial Growth of $SrTiO_3$ Thin Film on Si(100)", Osamu Nkagawara et al., J. Appl. Phys. (1995), pp. 7226–7230.

"A Proposal of Epitaxial Oxide Thin Film Structures for Future Oxide Electronics", M. Suzuki et al., Materials Science and Engineering B41 (1996, pp. 166–173.

"Crystalline Oxides on Silicon: The First Five Monolayers", R.A. McKee et al., Physical Review Letters, vol. 81, No. 14, pp. 3014–3017.

"Molecular Beam Epitaxy Growth of Epitaxial Barium Silicide, Barium Oxide, and Barium Titanate on Silicon", R.A. McKee et al., Oak Ridge National Laboratory, 1991 American Institute of Physics, pp. 782–784.

"Molecular Beam Epitaxy of $SrTiO_3$ Films on Si(100)-2×1 with SrO Buffer Layer", Toyokazu Tambo et al., Jpn. J. Appl. Phys., vol. 37 (1998) pp. 4454–4459.

"Roles of Buffer Layers in Epitaxial Growth of $SrTiO_3$ Films on Silicon Substrates", Bum Ki Moon et al., Jpn. J. Appl. Phys., vol. 33 (1994) pp. 1472–1477.

"The MBE Growth and Optical Quality of $BaTiO_3$ and $SrTiO_3$ Thin Films on MgO", R.A. McKee et al., Mat. Res. Soc. Symp. Proc. vol. 341, pp. 309–314.

"$BaSi_2$ and Thin Film Alkaline Earth Silicides on Silicon", R.A. McKee et al., Appl. Phys. Lett. 63 (20), Nov. 15, 1993, pp. 2818–2820.

"Surface Structures and the Orthorhombic Transformation of Thin Film $BaSi_2$ on Silicon", R. A. McKee et al., Mat. Res. Soc. Symp. Proc., vol. 221., pp. 131–136.

"Epitaxial Growth of $SrTiO_3$ Films on Si(100) Substrates Using a Focused Electron Beam Evaporation Method", Hiroyuki Mori et al., Jpn. J. Appl. Phys., vol. 30 (1991), pp. 1415–1417.

METHOD FOR FABRICATING A SEMICONDUCTOR STRUCTURE HAVING A CRYSTALLINE ALKALINE EARTH METAL OXIDE INTERFACE WITH SILICON

This application is a divisional of U.S. application Ser. No. 09/273,929 filed Sep. 14, 2000.

FIELD OF THE INVENTION

The present invention relates in general to a method for fabricating a semiconductor structure including a crystalline alkaline earth metal oxide interface between a silicon substrate and other oxides, and more particularly to a method for fabricating an interface including an atomic layer of an alkaline earth metal, silicon, and oxygen.

BACKGROUND OF THE INVENTION

An ordered and stable silicon (Si) surface is most desirable for subsequent epitaxial growth of single crystal thin films on silicon for numerous device applications, e.g., ferroelectrics or high dielectric constant oxides for non-volatile high density memory and logic devices. It is pivotal to establish an ordered transition layer on the Si surface, especially for subsequent growth of single crystal oxides, e.g., perovskites.

Some reported growth of these oxides, such as BaO and $BaTiO_3$ on Si(100) was based on a $BaSi_2$ (cubic) template by depositing one fourth monolayer of Ba on Si(100) using reactive epitaxy at temperatures greater than 850° C. See for example: R. McKee et al., *Appl. Phys. Lett.* 59(7), pp 782–784 (Aug. 12, 1991); R. McKee et al., *Appl. Phys. Lett.* 63(20), pp. 2818–2820 (Nov. 15, 1993); R. McKee et al., *Mat. Res. Soc. Symp. Proc.,* Vol. 21, pp. 131–135 (1991); U.S. Pat. No. 5,225,031, issued Jul. 6, 1993, entitled "Process for Depositing an Oxide Epitaxially onto a Silicon Substrate and Structures Prepared with the Process"; and U.S. Pat. No. 5,482,003, issued Jan. 9, 1996, entitled "Process for Depositing Epitaxial Alkaline Earth Oxide onto a Substrate and Structures Prepared with the Process". However, atomic level simulation of this proposed structure indicates that it likely is not stable at elevated temperatures.

Growth of $SrTiO_3$ on silicon (100) using an SrO buffer layer has been accomplished. T. Tambo et al., *Jpn. J. Appl. Phys.,* Vol. 37 (1998), pp. 4454–4459. However, the SrO buffer layer was thick (100 Å), thereby limiting application for transistor films, and crystallinity was not maintained throughout the growth.

Furthermore, $SrTiO_3$ has been grown on silicon using thick metal oxide buffer layers (60–120 Å) of Sr or Ti. B. K. Moon et al., *Jpn. J. Appl. Phys.,* Vol. 33 (1994), pp. 1472–1477. These thick buffer layers would limit the application for transistors.

SUMMARY OF INVENTION

Therefore, a method for fabricating a thin, stable crystalline interface with silicon is described below.

DETAILED DESCRIPTION OF THE PREFERRED EMBODIMENT

To form the novel interface between a silicon (Si) substrate and one or more layers of a single crystal oxide, various approaches may be used. Several examples will be provided for both starting with a Si substrate having a clean surface, and a Si substrate having silicon dioxide ($SiO_2$) on the surface. $SiO_2$ is amorphous rather than single crystalline and it is desirable for purposes of growing additional single crystal material on the substrate that a single crystal oxide be provided as the interface.

Figure 1:
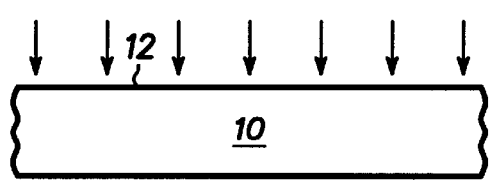
FIGS. 1–2 illustrate a cross-sectional view of a clean semiconductor substrate having an interface formed thereon in accordance with the present invention.
Figure 2:
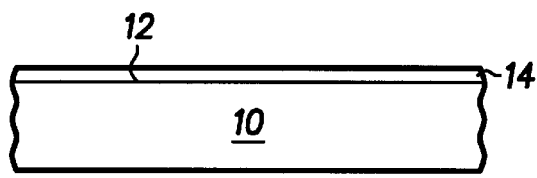

Turning now to the drawings in which like elements are designated with like numbers throughout, FIGS. 1 and 2 illustrate a semiconductor structure including a Si substrate 10 having a clean surface 12. A clean (2×1) surface 12 may be obtained with any conventional cleaning procedure, for example, with thermal desorption of $SiO_2$ at a temperature greater than or equal to 850° C., or by removal of the hydrogen from a hydrogen terminated Si(1×1) surface at a temperature greater than or equal to 300° C. in an ultra high vacuum. Hydrogen termination is a well known process in which hydrogen is loosely bonded to dangling bonds of the silicon atoms at surface 12 to complete the crystalline structure. The interface 14 of a crystaline material may be formed by supplying (as shown by the arrows in FIG. 1) controlled amounts of a metal, Si, and $O_2$, either simultaneously or sequentially to the surface 12 at a temperature less than or equal to 900° C. in a growth chamber with $O_2$ partial pressure less than or equal to $1\times10^{-9}$ mBar. The metal applied to the surface 12 to form the interface 14 may be any metal, but in the preferred embodiment comprises an alkaline-earth-metal, such as barium (Ba) or strontium (Sr).

As the application of the Ba, Si, and $O_2$ form $BaSiO_2$ as the interface 14, the growth is monitored using Reflection High Energy Electron Diffraction (RHEED) techniques which are well documented in the art and which can be used in situ, i.e., while performing the exposing step within the growth chamber. The RHEED techniques are used to detect or sense surface crystalline structures and in the present process change rapidly to strong and sharp streaks by the forming of an atomic layer of the $BaSiO_2$. It will of course be understood that once a specific manufacturing process is provided and followed, it may not be necessary to perform the RHEED techniques on every substrate.

The novel atomic structure of the interface 14 will be described in subsequent paragraphs.

It should be understood by those skilled in the art that the temperatures and pressures given for these processes are recommended for the particular embodiment described, but the invention is not limited to a particular temperature or pressure range.

Figure 5:
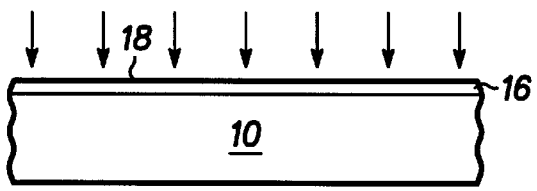
Figure 11:
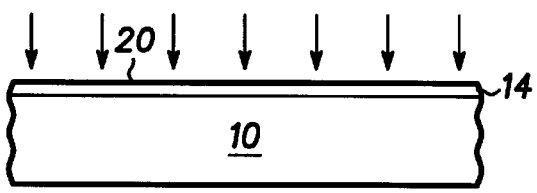
Figure 6:
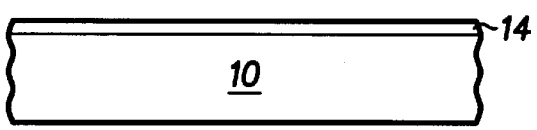
Figure 12:
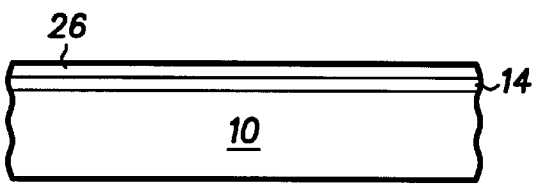

Referring to FIGS. 3–6, another approach comprises forming a Si substrate 10 having a surface 12, and a layer 16 of SiO$_2$ thereupon. The layer 16 of SiO$_2$ naturally exists (native oxide) once the Si substrate 10 is exposed to air (oxygen) or it may be formed purposely in a controlled fashion well known in the art, e.g., thermally by applying (arrows) oxygen onto the surface 12. The novel interface 14 may be formed at least in one of the two suggested embodiments as follows: By applying an alkaline-earth-metal to the surface 18 of SiO$_2$ layer 16 at 700–900° C., under an ultra high vacuum. More specifically, the Si substrate 10 and the amorphous SiO$_2$ layer 16 are heated to a temperature below the sublimation temperature of the SiO$_2$ layer 16 (generally below 900° C.). This can be accomplished in a molecular beam epitaxy chamber or Si substrate 10 can be at least partially heated in a preparation chamber after which it can be transferred to the growth chamber and the heating completed. Once the Si substrate 10 is properly heated and the pressure in the growth chamber has been reduced appropriately, the surface 12 of the Si substrate 10 having SiO$_2$ layer 16 thereon is exposed to a beam of metal, preferably an alkaline-earth-metal, as illustrated in FIG. 5. In a preferred embodiment, the beam is Ba or Sr which is generated by resistively heating effusion cells or from e-beam evaporation sources. In a specific example, Si substrate 10 and SiO$_2$ layer 16 are exposed to a beam of Ba. The Ba joins the SiO$_2$ and converts the SiO$_2$ layer 16 into the interface 14 comprising BaSiO$_2$ in a crystalline form. Alternatively, an alkaline-earth-metal may be provided to the surface 18 at lower temperatures, annealing the result at 700–900° C., in an ultra high vacuum.

Once the interface 14 is formed, one or more layers of a single crystal oxide may be formed on the surface of the interface 14. However, an optional layer of an alkaline-earth-metal oxide, such as BaO or SrO, may be placed between the interface 14 and the single crystal oxide. This alkaline-earth-metal oxide provides a low dielectric constant (advantageous for certain uses such as memory cells) and also prevents oxygen from migrating from the single crystal oxide to the Si substrate 10.

Figure 7:
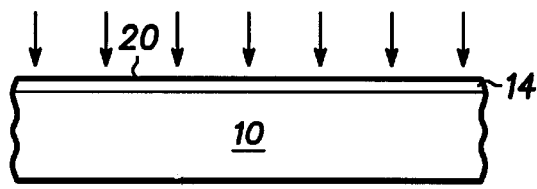
FIGS. 7–8 illustrate a cross-sectional view of an alkaline-earth-metal oxide layer formed on the structures illustrated in FIGS. 1–6 in accordance with the present invention.
Figure 8:
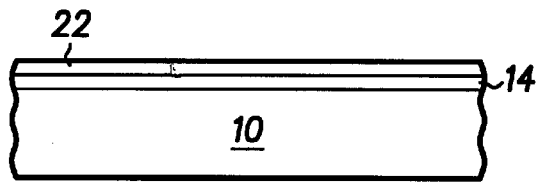
Figure 3:
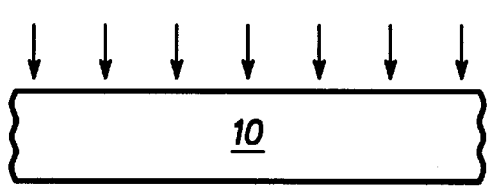
FIGS. 3–6 illustrate a cross-sectional view of a semiconductor substrate having an interface formed from a silicon dioxide layer in accordance with the present invention.
Figure 9:
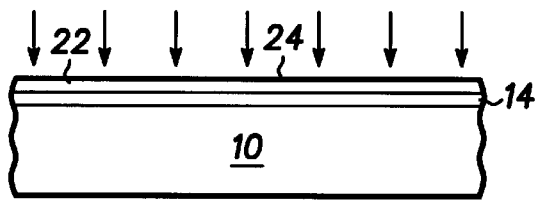
FIGS. 9–12 illustrate a cross-sectional view of a perovskite formed on the structures of FIGS. 1–8 in accordance with the present invention.
Figure 4:
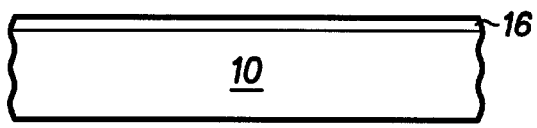
Figure 10:
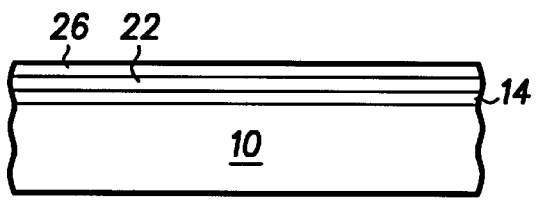

Referring to FIGS. 7 and 8, the formation of alkaline-earth-metal oxide layer 22 may be accomplished by either the simultaneous or alternating supply to the surface 20 of the interface 14 of an alkaline-earth-metal and oxygen at less than or equal to 700° C. and under O$_2$ partial pressure less than or equal to 1×10$^{-5}$ mBar. This alkaline-earth-metal oxide layer 22 may, for example, comprise a thickness of 50–500 Å.

Referring to FIGS. 9–12, a single crystal oxide layer 26, such as an alkaline-earth-metal perovskite, may be formed on either the surface 20 of the interface 14 or the surface 24 of the alkaline-earth-metal oxide layer 22 by either the simultaneous or alternating supply of an alkaline-earth-metal oxide, oxygen, and a transition metal, such as titanium, at less than or equal to 700° C. under an oxygen partial pressure less than or equal to 1×10$^{-5}$ mBar. This single crystal oxide layer 26 may, for example, comprise a thickness of 50–1000 Å and will be substantially lattice matched with the underlying interface 14 or alkaline-earth-metal oxide layer 22. It should be understood that the single crystal oxide layer 26 may comprises one or more layers in other embodiments.

Figure 13:
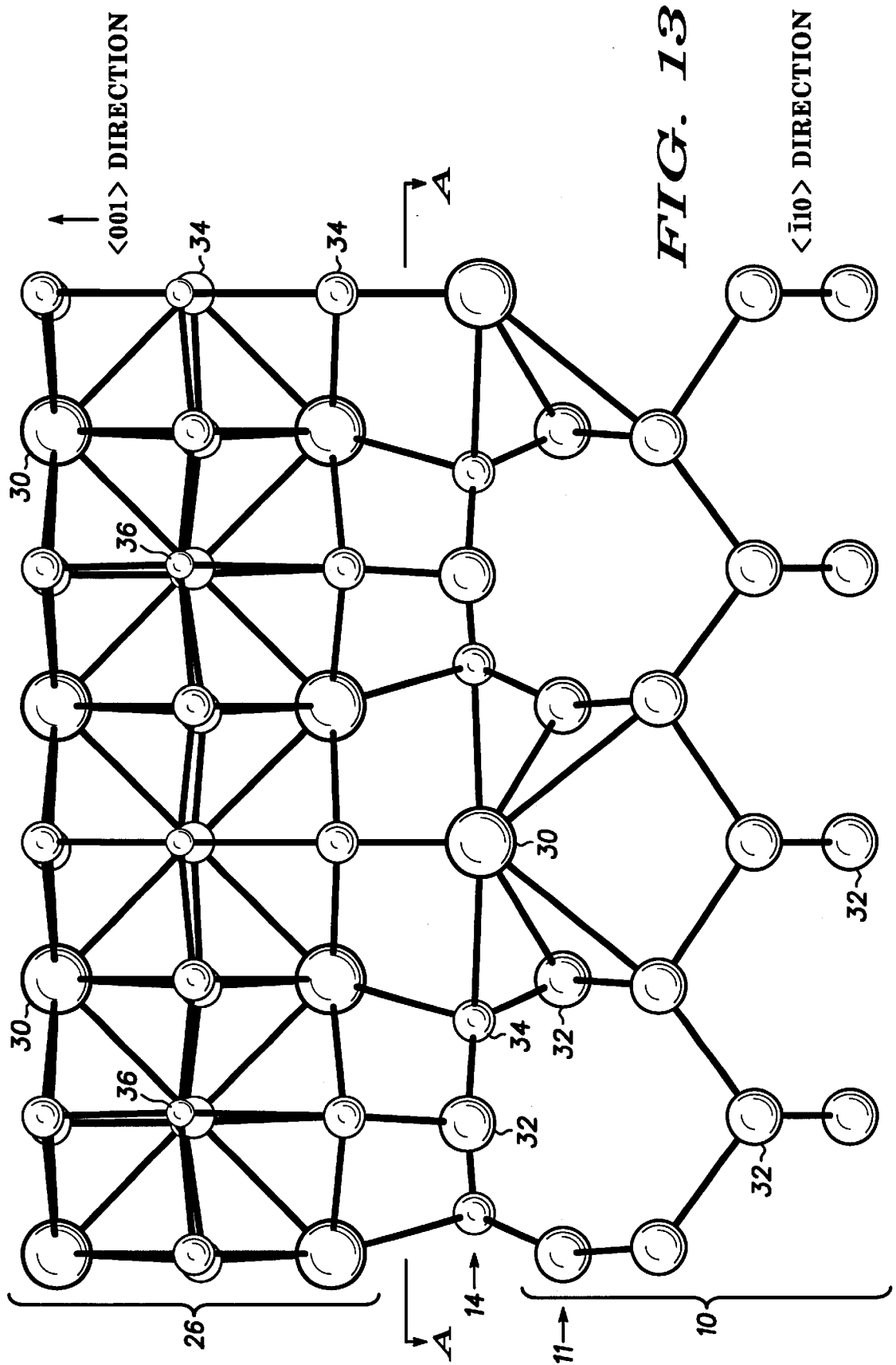
FIG. 13 illustrates a side view of the atomic structure of one embodiment of the layers of FIG. 12 in accordance with the present invention.

Referring to FIG. 13, a side view (looking in the <$\bar{1}$10> direction) of the atomic configuration of the Si substrate 10, interface 14, and single crystal oxide (specifically a alkaline-earth-metal perovskite) layer 26 is shown. The configuration shown comprises, in relative sizes, for illustrative purposes, from larger to smaller, barium atoms 30, silicon atoms 32, oxygen atoms 34, and titanium atoms 36. The Si substrate 10 comprises only silicon atoms 32. The interface 14 comprises metal atoms (which in the preferred embodiment are illustrated as barium atoms 30), silicon atoms 32, and oxygen atoms 34. The single crystal oxide layer 26 comprises barium atoms 30, oxygen atoms 34, and titanium atoms 36.

Figure 14:
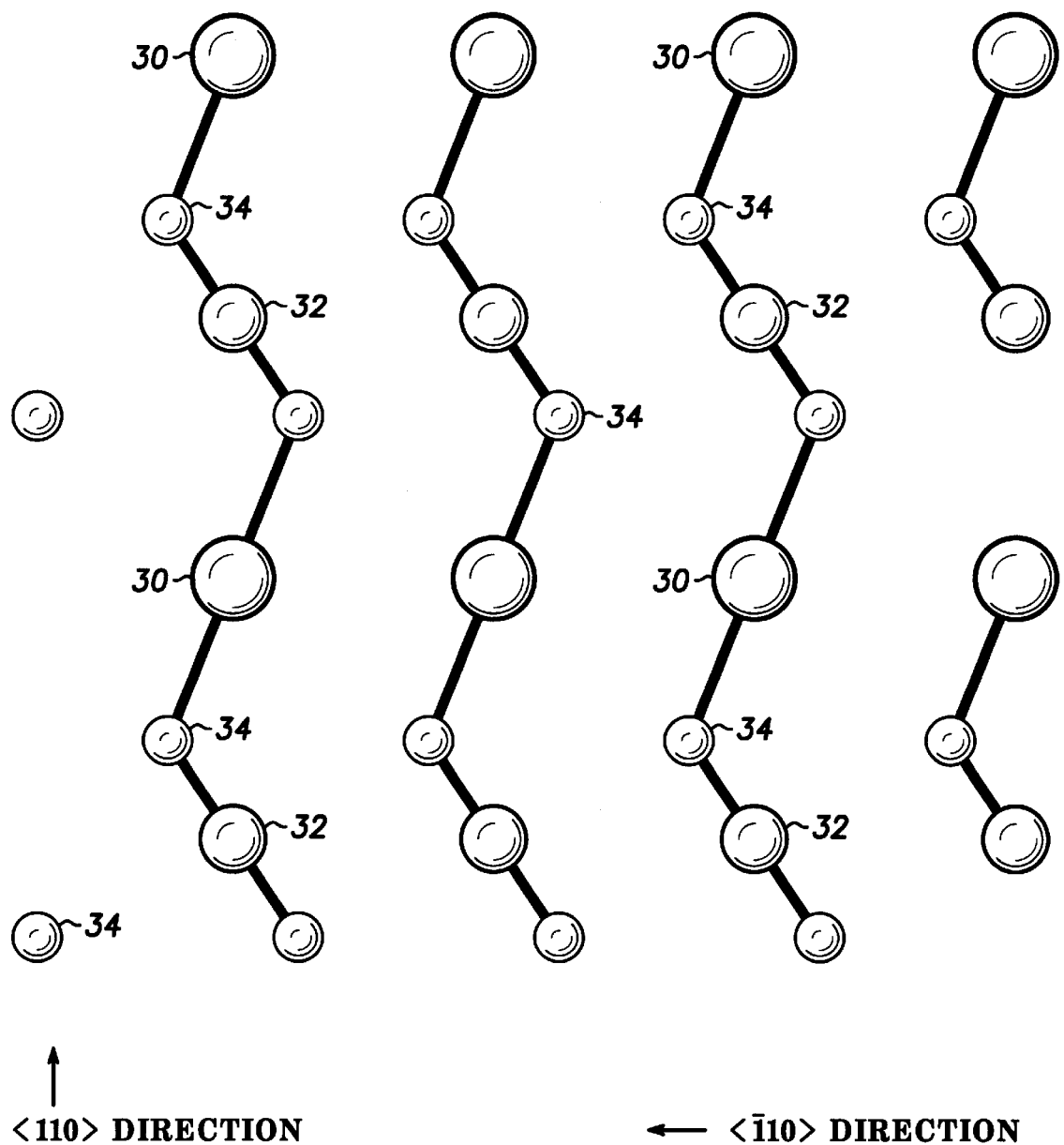
FIG. 14 illustrates a top view along view line AA of FIG. 13 of the interface.

Referring to FIG. 14, a top view of the interface along view line AA of FIG. 13, shows the arrangement of the barium, silicon, and oxygen atoms 30, 32, 34.

Figure 15:
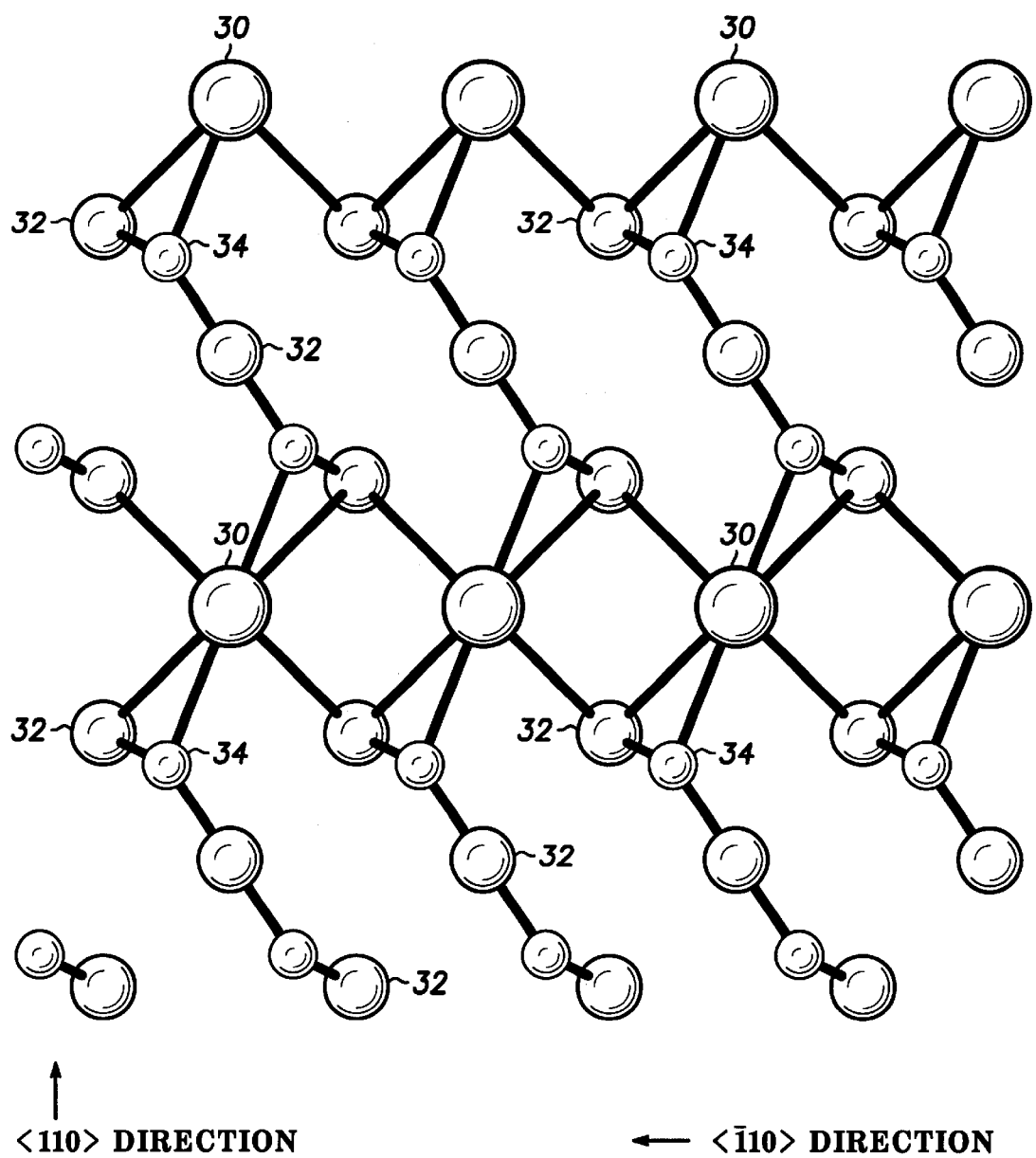
FIG. 15 illustrates a top view along view line AA of FIG. 13 including the interface and the adjacent atomic layer of the substrate.

Referring to FIG. 15, a top view along line AA of FIG. 13, shows the interface 14 and the top atomic layer 11 of the Si substrate 10.

For this discussion, a monolayer equals 6.8×10$^{14}$ atoms/cm$^2$ and an atomic layer is one atom thick. It is seen that the interface 14 shown in the FIGs. comprises a single atomic layer, but could be more than one atomic layer, while the Si substrate 10 and the alkaline-earth-metal metal oxide layer may be many atomic layers. Note that in FIG. 13, only four atomic layers of the Si substrate 10 and only three atomic layers of the single crystal oxide layer 26 are shown. The interface 14 comprises a half monolayer of the alkaline-earth-metal, a half monolayer of silicon, and a monolayer of oxygen. Each barium atom 30 is substantially equally spaced from four of the silicon atoms 32 in the Si substrate 10. The silicon atoms 32 in the interface 14 are substantially on a line and equally spaced between the alkaline-earth-metal atoms in the <110> direction. Each silicon atom 32 in the top layer of atoms in the Si substrate 10 is bonded to an oxygen atom 34 in the interface 14 and each silicon atom 32 in the interface 14 is bonded to two oxygen atoms 34 in the interface 14. The interface 14 comprises rows of barium, silicon, and oxygen atoms 30, 32, 34 in a 2×1 configuration on a (001) surface of the Si substrate 10, 1× in the <$\bar{1}$10> direction and 2× in the <110> direction. The interface 14 has a 2×1 reconstruction.

A method for fabricating a thin, crystalline interface 14 with silicon 10 has been described herein. The interface 14 may comprise a single atomic layer. Better transistor applications are achieved by the interface 14 being thin, in that the electrical coupling of the overlying oxide layers to the Si substrate 10 is not compromised, and in that the interface 14 is more stable since the atoms will more likely maintain their crystalinity in processing.

What is claimed is:

1. A method of fabricating a semiconductor structure comprising the steps of:
   providing a silicon substrate having a surface;
   forming on the surface of the silicon substrate an interface comprising a single atomic layer of silicon, oxygen, and a metal; and
   forming one or more layers of a single crystal oxide on the interface.

2. The method of fabricating a semiconductor structure of claim 1 wherein the forming the interface step includes forming a 2×1 reconstruction.

3. The method of fabricating a semiconductor structure of claim 1 wherein the forming an interface step includes forming the interface in an ultra-high-vacuum system.

4. The method of fabricating a semiconductor structure of claim 1 wherein the forming an interface step includes forming the interface in a chemical vapor deposition system.

5. The method of fabricating a semiconductor structure of claim 1 wherein the forming an interface step includes forming the interface in a physical vapor deposition system.

6. The method of fabricating a semiconductor structure of claim 1 wherein the forming an interface step comprises forming a single atomic layer of silicon, oxygen, and an alkaline-earth-metal.

7. The method of fabricating a semiconductor structure of claim 6 wherein the alkaline-earth-metal is selected from the group of barium and strontium.

8. The method of fabricating a semiconductor structure of claim 1 wherein forming an interface step comprises the steps of:

forming a half of a monolayer of an alkaline-earth-metal;

forming a half of a monolayer of silicon; and forming a monolayer of oxygen.

9. A method of fabricating a semiconductor structure comprising the steps of:

providing a silicon substrate having a surface;

providing an alkaline-earth-metal on the surface of the silicon substrate; and providing silicon and oxygen to form an interface comprising a single atomic interface with the surface of the silicon substrate.

10. The method of fabricating a semiconductor structure of claim 9 wherein the providing silicon and oxygen step comprises forming an interface having a 2×1 reconstruction.

11. The method of fabricating a semiconductor structure of claim 9 wherein the steps of providing an alkaline-earth-metal and providing silicon and oxygen are accomplished in an ultra-high-vacuum system.

12. The method of fabricating a semiconductor structure of claim 9 wherein the steps of providing an alkaline-earth-metal and providing silicon and oxygen are accomplished in a chemical vapor deposition system.

13. The method of fabricating a semiconductor structure of claim 9 wherein the steps of providing an alkaline-earth-metal and providing silicon and oxygen are accomplished in a physical vapor deposition system.

14. The method of fabricating a semiconductor structure of claim 9 wherein the providing silicon and oxygen step comprises forming a single atomic layer of silicon, oxygen, and an alkaline-earth-metal.

15. The method of fabricating a semiconductor structure of claim 14 wherein the alkaline-earth-metal is selected from the group of barium and strontium.

16. The method of fabricating a semiconductor structure of claim 9 wherein the providing silicon and oxygen step comprises the steps of:

forming a half of a monolayer of an alkaline-earth-metal;

forming a half of a monolayer of silicon; and forming a monolayer of oxygen.

17. The method of fabricating a semiconductor structure of claim 1 wherein the single crystal oxide is an alkaline-earth metal oxide.

18. The method of fabricating a semiconductor structure of claim 17 wherein the alkaline-earth-metal is selected from the group of barium and strontium.

19. The method of fabricating a semiconductor structure of claim 1 wherein the single crystal oxide is an alkaline-earth-metal perovskite.

20. The method of fabricating a semiconductor structure of claim 19 wherein the alkaline-earth-metal is selected from the group of barium and strontium, and the transition metal is selected from the group of Ti and Zr.

21. The method of fabricating a semiconductor structure of claim 1 wherein the forming one or more layers of a single crystal oxide step comprises of the steps of:

forming one or more layers of oxide by the simultaneous or alternating supply of at least one metal and oxygen; and heating the one or more oxide layers in-situ.

22. The method of fabricating a semiconductor structure of claim 21 further comprising the step of:

annealing at least one of the oxide layers in-situ.

23. The method of fabricating a semiconductor structure of claim 9 comprising the step of:

forming one or more layers of a single crystal oxide on the interface.

24. The method of fabricating a semiconductor structure of claim 23 wherein the providing silicon and oxygen step comprises forming an interface having a 2×1 reconstruction.

25. The method of fabricating a semiconductor structure of claim 23 wherein the steps of providing an alkaline-earth-metal and providing silicon and oxygen are accomplished in an ultra-high-vacuum system.

26. The method of fabricating a semiconductor structure of claim 23 wherein the steps of providing an alkaline-earth-metal and providing silicon and oxygen are accomplished in a chemical vapor deposition system.

27. The method of fabricating a semiconductor structure of claim 23 wherein the steps of providing an alkaline-earth-metal and providing silicon and oxygen are accomplished in a physical vapor deposition system.

28. The method of fabricating a semiconductor structure of claim 24 wherein the providing silicon and oxygen step comprises forming a single atomic layer of silicon, oxygen, and an alkaline-earth-metal.

29. The method of fabricating a semiconductor structure of claim 28 wherein the alkaline-earth-metal is selected from the group of barium and strontium.

30. The method of fabricating a semiconductor structure of claim 23 wherein the providing silicon and oxygen step comprises the steps of:

forming a half of a monolayer of an alkaline-earth-metal;

forming a half of a monolayer of silicon; and forming a monolayer of oxygen.

31. The method of fabricating a semiconductor structure of claim 23 wherein the single crystal oxide is an alkaline-earth metal oxide.

32. The method of fabricating a semiconductor structure of claim 30 wherein the alkaline-earth-metal is selected from the group of barium and strontium.

33. The method of fabricating a semiconductor structure of claim 23 wherein the single crystal oxide is an alkaline-earth-metal perovskite.

34. The method of fabricating a semiconductor structure of claim 33 wherein the alkaline-earth-metal is selected from the group of barium and strontium, and the transition metal is selected from the group of Ti and Zr.

35. The method of fabricating a semiconductor structure of claim 23 wherein the forming one or more layers of a single crystal oxide step comprises of the steps of:

forming one or more layers of oxide by the simultaneous or alternating supply of at least one metal and oxygen; and heating the one or more oxide layers in-situ.

36. The method of fabricating a semiconductor structure of claim 35 further comprising the steps of:

annealing at least one of the oxide layers in-situ.

* * * * *

UNITED STATES PATENT AND TRADEMARK OFFICE
CERTIFICATE OF CORRECTION

PATENT NO.   : 6,224,669 B1
DATED        : May 1, 2001
INVENTOR(S)  : Zhiyi Yu et al.

It is certified that error appears in the above-identified patent and that said Letters Patent is hereby corrected as shown below:

<u>Title page,</u>
Inventor's last name, "Yi" should be replace with -- Yu --. The first named inventor should be Zhiyi Yu Signed and Sealed this Eleventh Day of December, 2001

*Attest:*

NICHOLAS P. GODICI
*Attesting Officer*       *Acting Director of the United States Patent and Trademark Office*

UNITED STATES PATENT AND TRADEMARK OFFICE
CERTIFICATE OF CORRECTION

PATENT NO. : 6,224,669 B1 Page 1 of 1
DATED : May 1, 2001
INVENTOR(S) : Zhiyi Yu et al.

It is certified that error appears in the above-identified patent and that said Letters Patent is hereby corrected as shown below:

Column 5,
Line 49, delete "alkaline-earth metal" and add -- alkaline-earth-metal --.

Column 6,
Line 41, delete "alkaline-earth metal" and add -- alkaline-earth-metal --.

Signed and Sealed this

Twenty-second Day of October, 2002

Attest:

Attesting Officer

JAMES E. ROGAN
Director of the United States Patent and Trademark Office